(12) United States Patent
Onaka et al.

(10) Patent No.: US 12,107,024 B2
(45) Date of Patent: Oct. 1, 2024

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Takayuki Onaka, Tokyo (JP); Yuki Yano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 409 days.

(21) Appl. No.: 17/682,603

(22) Filed: Feb. 28, 2022

(65) Prior Publication Data

US 2022/0384283 A1 Dec. 1, 2022

(30) Foreign Application Priority Data

May 27, 2021 (JP) ................. 2021-088937

(51) Int. Cl.
*H01L 23/10* (2006.01)
*H01L 21/52* (2006.01)
*H01L 23/053* (2006.01)

(52) U.S. Cl.
CPC ............ *H01L 23/10* (2013.01); *H01L 21/52* (2013.01); *H01L 23/053* (2013.01)

(58) Field of Classification Search
CPC ....... H01L 21/50; H01L 23/053; H01L 21/52; H01L 23/10; H01L 23/24
See application file for complete search history.

(56) References Cited

U.S. PATENT DOCUMENTS

2004/0047127 A1* 3/2004 Yamauchi ............. H01L 21/563
257/E21.511
2016/0336716 A1* 11/2016 Adachi ................. H01L 33/486

FOREIGN PATENT DOCUMENTS

JP 2000-323593 A 11/2000

* cited by examiner

*Primary Examiner* — Jaehwan Oh
(74) *Attorney, Agent, or Firm* — Studebaker & Brackett PC

(57) ABSTRACT

An object is to provide a technique that can suppress wet-spreading of an adhesive used to bond a case and a metal base to each other and secure the height position of the adhesive required to fill a gap created between the case and the metal base. A semiconductor device includes a metal base, an insulating substrate arranged on the metal base, a semiconductor element mounted on the insulating substrate, and a case bonded on the metal base so as to surround side surfaces of the insulating substrate and the semiconductor element, in which a pair of metal oxide films having a protruding shape is provided on a peripheral edge portion of the metal base, and the case is bonded to the metal base by an adhesive arranged in a region between the metal oxide films in the pair.

7 Claims, 5 Drawing Sheets

F I G. 1
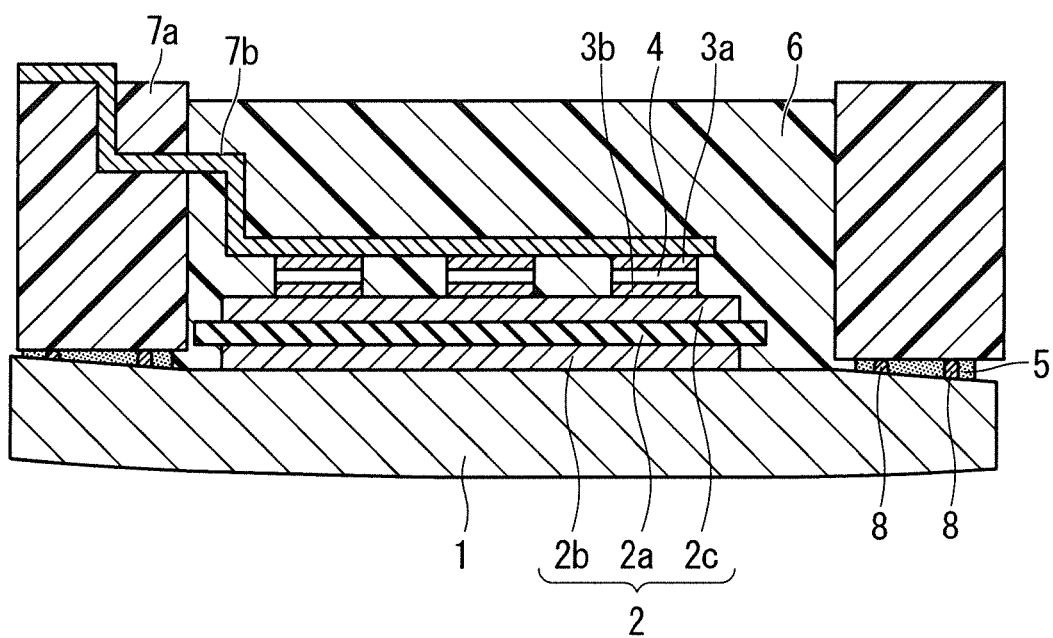

SEMICONDUCTOR DEVICE AND METHOD OF MANUFACTURING SEMICONDUCTOR DEVICE

BACKGROUND OF THE INVENTION

Field of the Invention

The present disclosure relates to a semiconductor device and a method of manufacturing the semiconductor device.

Description of the Background Art

Conventionally, in order to implement high current density and high reliability, a semiconductor device having a structure in which a lead electrode provided in a case is bonded to semiconductor elements mounted on an insulating substrate on a metal base by a bonding material such as solder. In such the semiconductor device, by protecting the inside from an external environment such as humidity, a sealing resin is filled inside the case in order to secure a high dielectric strength and obtain high reliability.

Further, in Japanese Patent Application Laid-Open No. 2000-323593, a technique is disclosed in which a groove is formed in a heat radiating plate (corresponding to a metal base) to serve as an adhesive reservoir part, and an adhesive layer is partially made thick when bonding a sealing case (corresponding to a case) to the heat radiating plate so as to improve the airtightness of a semiconductor device.

In the conventional semiconductor device, in the bonding process of the case to the metal base, the adhesive wet-spreads when it takes long for the case to firmly bond to the metal base via the adhesive after application of the adhesive. When the case is bonded to the metal base via the adhesive while the adhesive is wet-spreading, the adhesive spreads under the lower surface of the metal base, so that the height position of the adhesive lowers. As a result, the height position of the adhesive required to fill the gap between the case and the metal base caused by the corrugation of the metal base or the shape difference between the case and the metal base is failed to be secured.

Also in the technique described in Japanese Patent Application Laid-Open No. 2000-323593, despite the adhesive layer being made partially thick by providing a groove serving as an adhesive reservoir part in the heat dissipation plate, the height position of the adhesive is failed to be secured.

SUMMARY

An object of the present disclosure is to provide a technique that can suppress wet-spreading of an adhesive used to bond a case and a metal base to each other and secure the height position of the adhesive required to fill a gap created between the case and the metal base.

The semiconductor device according to the present disclosure includes a metal base, an insulating substrate, a semiconductor element, and a case. The insulating substrate is arranged on the metal base. The semiconductor element is mounted on the insulating substrate. The case is bonded on the metal base so as to surround the side surfaces of the insulating substrate and the semiconductor element. A pair of first metal oxide films having a protruding shape is provided on a peripheral edge portion of the metal base. The case is bonded to the metal base by an adhesive arranged in a region between the first metal oxide films in the pair.

The adhesive used to bond the case to the metal base is blocked by the pair of the first metal oxide films; therefore, the adhesive is prevented from wet-spreading. Consequently, the height position of the adhesive required to fill the gap between the case and the metal base can be secured These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a cross-sectional view of a semiconductor device according to the first embodiment;

DESCRIPTION OF THE PREFERRED EMBODIMENTS

First Embodiment

Figure 2:
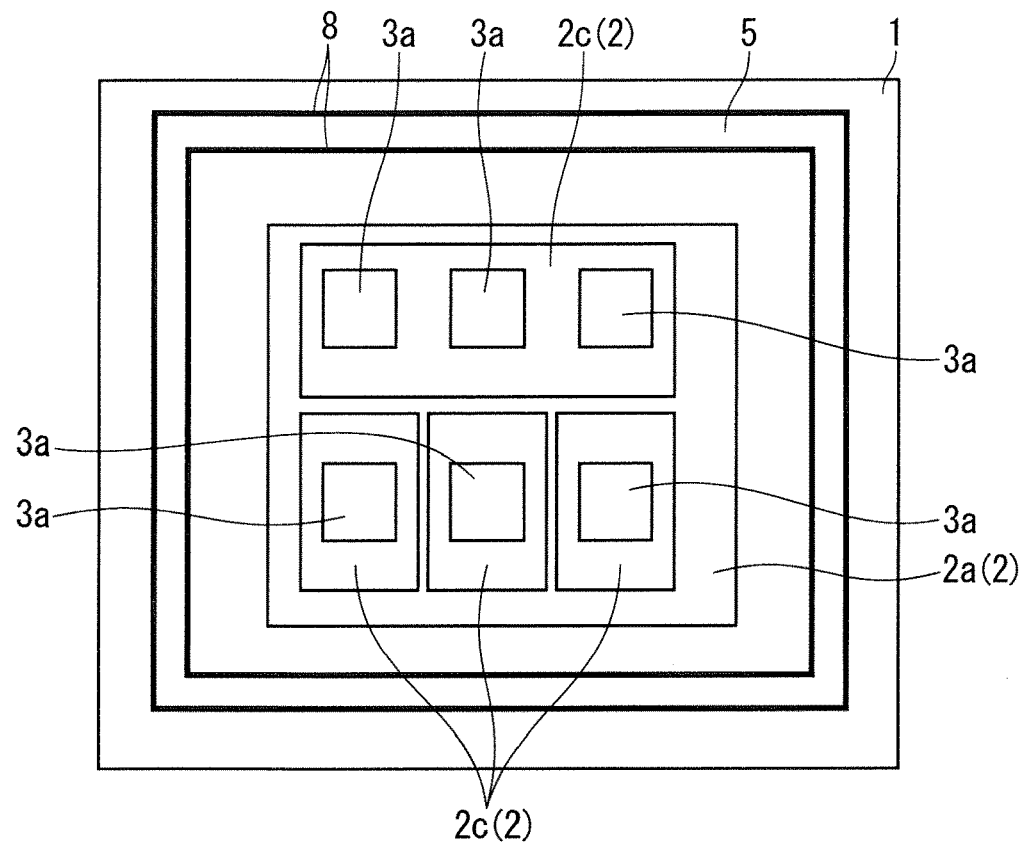
FIG. 2 is a top view illustrating a state before case bonding in the semiconductor device according to the first embodiment.

The first embodiment will be described below with reference to the drawings. FIG. 1 is a cross-sectional view of a semiconductor device according to the first embodiment. FIG. 2 is a top view illustrating a state before case 7a bonding in the semiconductor device according to the first embodiment.

As illustrated in FIG. 1, the semiconductor device includes a metal base 1, an insulating substrate 2, a plurality of semiconductor elements 4, a case 7a, a lead electrode 7b, a pair of metal oxide films 8 (corresponding to a first metal oxide film), an adhesive 5, and a sealing resin 6.

As illustrated in FIG. 2, the metal base 1 is formed of a metal such as aluminum in a rectangular shape in top view. As illustrated in FIGS. 1 and 2, the insulating substrate 2 is formed in a rectangular shape in top view and is arranged on the metal base 1. Specifically, the insulating substrate 2 is arranged in a region on the upper surface of the metal base 1 excluding the peripheral edge portion.

The insulating substrate 2 includes an insulating layer 2a, a circuit pattern 2b provided on the lower surface of the insulating layer 2a, and a circuit pattern 2c provided on the upper surface of the insulating layer 2a. The insulating layer 2a is composed of a ceramic such as aluminum nitride and silicon nitride, or a resin. The circuit patterns 2b and 2c are composed of metal such as copper.

The semiconductor elements 4 are mounted on the insulating substrate 2. Specifically, the semiconductor elements 4 are bonded to the upper surface of the circuit pattern 2c by a bonding material 3b such as solder. As the semiconductor element 4, an Insulated Gate Bipolar Transistor (IGBT), a diode, or a Reverse-Conducting IGBT made of a Si material is typically used. Also, as the semiconductor element 4, a Metal Oxide Semiconductor Field Effect Transistor (MOSFET) made of a SiC material or a Schottky barrier diode may be used.

Although six semiconductor elements 4 are illustrated in FIG. 2, the number of semiconductor elements 4 is not limited, and a required number of semiconductor elements 4 can be mounted according to an application of a semiconductor device. Further, a plurality of types of semiconductor elements 4 can be mounted.

As illustrated in FIG. 1, the case 7a is composed of a resin and is formed in a rectangular frame shape in top view. The case 7a is bonded to the peripheral edge portion on the upper surface of the metal base 1 by the adhesive 5. The lead electrode 7b is integrally formed with the case 7a by insert molding. One end side of the lead electrode 7b is provided on the upper surface of the case 7a and is connected to an external device (not illustrated). The other end side of the lead electrode 7b extends inside the case 7a and is bonded to the plurality of semiconductor elements 4 by a bonding material 3a such as solder.

The sealing resin 6 seals the inside of the case 7a in order to protect the insulating substrate 2 and the plurality of semiconductor elements 4 from the external environment such as humidity. Note that, in FIG. 1, the semiconductor device is illustrated in a simplified manner, and the metal wires and signal terminals connected to the plurality of semiconductor elements 4 are not illustrated. Further, heat radiation fins and the like may be attached to the lower surface of the metal base 1.

Next, the pair of the metal oxide films 8 which is a feature of the first embodiment will be described. As illustrated in FIGS. 1 and 2, the pair of the metal oxide films 8 is formed in a protruding shape protruding upward, and is provided on the peripheral edge portion on the upper surface of the metal base 1. Specifically, the pair of the metal oxide films 8 is continuously formed in a line along the peripheral edge portion on the upper surface of the metal base 1. Also, the width of the pair of the metal oxide films 8 is constant.

The adhesive 5 used to bond the case 7a to the metal base 1 is also continuously applied in a line along the peripheral edge portion on the upper surface of the metal base 1 and is arranged in the region between the pair of the metal oxide films 8. The adhesive 5 is a silicone-based or epoxy-based adhesive. The adhesive 5 is surrounded by the pair of metal oxide films 8; therefore, the adhesive 5 is prevented from wet-spreading to the outside of the region between metal oxide films 8 in the pair.

The pair of metal oxide films 8 is formed by a laser processing device such as a fiber laser before the application of the adhesive 5. In this case, the conditions such as wavelength and frequency in the laser processing device are the conditions for forming the metal oxide on the metal base 1 and not the conditions for melting or evaporating the metal on the metal base 1. By performing processing using a laser processing device under these conditions, a pair of metal oxide films 8 having a protruding shape is formed. The pair of the metal oxide films 8 can also be formed by a method other than laser processing.

Inventors found in experiments that the wet-spreading of the adhesive 5 with the passage of time after the application of the adhesive 5 can be suppressed if the adhesive 5 is a silicone-based adhesive having a viscosity of, for example, about 150 Pa s, and the adhesive 5 is controlled to have the width of about 1 mm and the height position of about 1 mm, and if the height position of the pair of the metal oxide films 8 is 0.02 mm or more. In the above description, that the pair of the metal oxide films 8 is continuously formed in a line shape along the peripheral edge portion on the upper surface of the metal base 1 has been described, however, the formation of the pair of the metal oxide films 8 is not limited thereto and it may be formed intermittently along the peripheral edge portion on the upper surface of the metal base 1.

Figure 3:
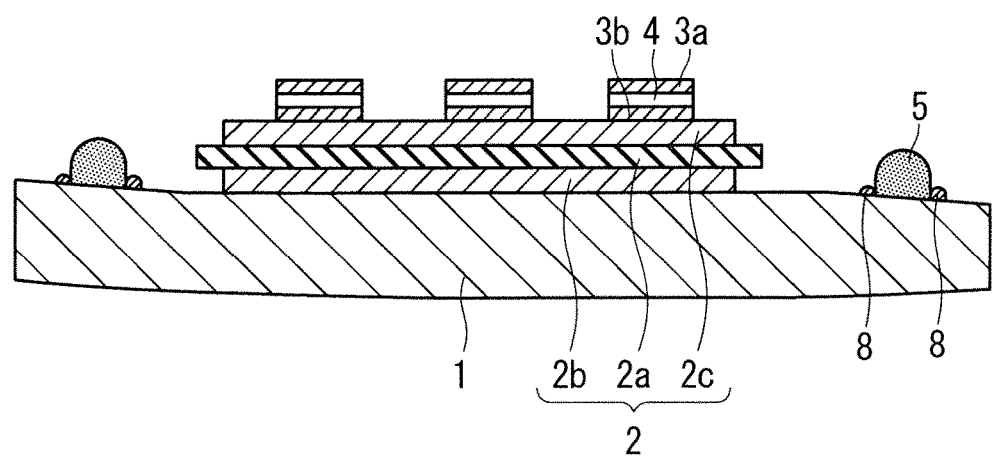
FIG. 3 is a cross-sectional view for explaining an assembly procedure of the semiconductor device according to the first embodiment.
Figure 4:
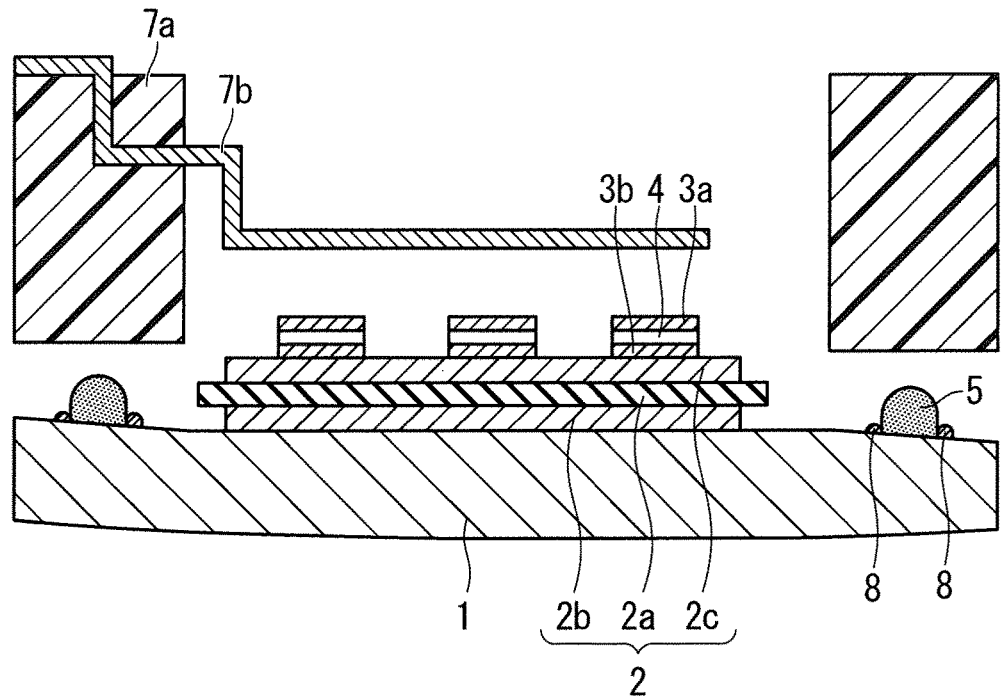
FIG. 4 is a cross-sectional view for explaining an assembly procedure of the semiconductor device according to the first embodiment.
Figure 5:
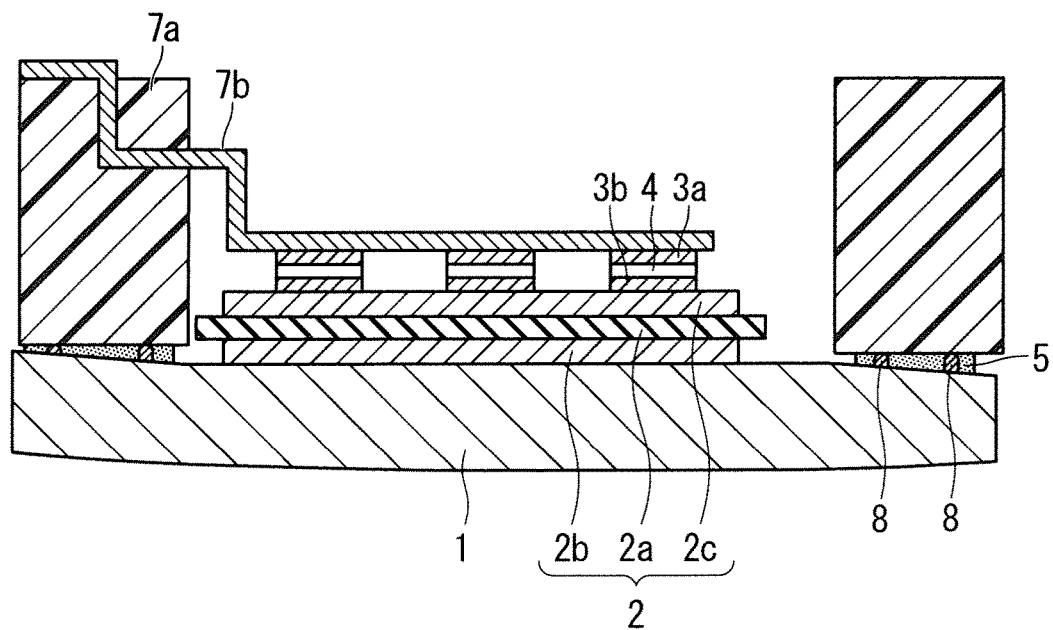
FIG. 5 is a cross-sectional view for explaining an assembly procedure of the semiconductor device according to the first embodiment.

Next, the procedure for assembling the semiconductor device according to the first embodiment will be described with reference to FIGS. 3 to 5. FIGS. 3 to 5 are cross-sectional views for explaining an assembly procedure of the semiconductor device according to the first embodiment.

As illustrated in FIG. 3, the insulating substrate 2 is bonded to the upper surface of the metal base 1, and a plurality of semiconductor elements 4 are bonded to the upper surface of the insulating substrate 2 by the bonding material 3b. Solder is used as the bonding material 3b. Soldering is performed by heating solder to a temperature that exceeds the melting point of solder.

When paste solder is used as the bonding material 3b, the paste solder is printed on the upper surface of the insulating substrate 2. When plate solder is used as the bonding material 3b, the plate solder is arranged on the upper surface of the insulating substrate 2.

Next, the pair of metal oxide films 8 is formed on the peripheral edge portion of the upper surface of the metal base 1 by the laser processing device. Along with the formation of the pair of the metal oxide films 8, a control number for individual identification control of the product may be laser-printed on the upper surface of the metal base 1.

Next, the adhesive 5 is applied to the region between the metal oxide films 8 in the pair in order to bond the case 7a integrally provided with the lead electrode 7b to the metal base 1. After the adhesive 5 is applied, when the time until the case 7a is firmly bonded to the metal base 1 via the adhesive 5 takes long, the adhesive 5 tends to wet-spread, however, the adhesive 5 is blocked by the pair of the metal oxide films 8 and the adhesive 5 is prevented from wet-spreading to the outside of the region.

As illustrated in FIGS. 4 and 5, the case 7a is bonded to the upper surface of the metal base 1 in a state of being firmly bonded to the adhesive 5 applied to the upper surface of the metal base 1. As illustrated in FIG. 4, when the height position of the adhesive 5 is higher than the height position of the pair of the metal oxide films 8, although the adhesive 5 is pressed and spreads when the case 7a is firmly bonded to the metal base 1 via the adhesive 5, the adhesive 5 can stay around the pair of metal oxide films 8 and be prevented from spreading under the lower surface of the metal base 1.

The case 7a may be firmly bonded to the upper surface of the metal base 1 by appropriately applying pressure with a jig or the like. Also, after the case 7a is firmly bonded to the metal base 1, cure heating may be performed as necessary to cure the adhesive 5.

As illustrated in FIG. 5, the other end side of the lead electrode 7b is bonded to the upper surface of the plurality of semiconductor elements 4 by the bonding material 3a. The bonding material 3a is determined in consideration of the operating temperature of the semiconductor device, and typically, solder is used as the bonding material 3a. When the bonding material 3a, which is solder, is heated, cure heating may be performed to cure the adhesive 5.

Next, the case 7a is filled with the sealing resin 6 (see FIG. 1), and the insulating substrate 2, the plurality of semiconductor elements 4, and the other end side of the lead electrode 7b are sealed by the sealing resin 6. Silicone gel or an epoxy resin is used as the sealing resin 6, but not limited thereto, and any resin having physical properties such as desired elastic modulus, heat resistance, adhesiveness, and linear thermal expansion coefficient may suffice. The desired elastic modulus is, for example, about 0.1 MPa or more and 10 MPa or less for a silicone gel, about 9 GPa or more and 13 GPa or less for an epoxy resin, and the desired heat resistance is about 200° C. at the maximum.

After filling the sealing resin 6, the semiconductor device assembly is placed in a curing furnace or the like in order to cure the sealing resin 6, and the necessary curing is performed to complete the semiconductor device. After that, the semiconductor device is inspected for necessary electrical characteristics and the like.

As described above, the semiconductor device according to the first embodiment includes the metal base 1, the insulating substrate 2 arranged on the metal base 1, the semiconductor elements 4 mounted on the insulating substrate 2, and the case 7a bonded on a metal base 1 so as to surround the side surfaces of the insulating substrate 2 and the semiconductor elements 4, in which the pair of metal oxide films 8 having a protruding shape is provided on the peripheral edge portion of the metal base 1, and the case 7a is bonded to the metal base 1 by an adhesive 5 arranged in the region between the metal oxide films 8 in the pair.

Further, a method of manufacturing the semiconductor device according to the first embodiment includes a step (a) in which the insulating substrate 2 is bonded on the metal base 1 and the semiconductor elements 4 are mounted on the insulating substrate 2, a step (b) in which the pair of metal oxide films 8 having a protruding shape is formed on the peripheral edge portion of the metal base 1, a step (c) in which the adhesive 5 is applied in the region between the metal oxide films 8 in the pair, a step (d) in which the case 7a is bonded on the metal base 1 by the adhesive 5, a step (e) in which the lead electrode 7b provided on the case 7a is bonded to the semiconductor elements 4, and a step (f) in which the sealing resin 6 is filled inside the case 7a.

Accordingly, after the adhesive 5 is applied, when the time until the case 7a is firmly bonded to the metal base 1 via the adhesive 5 takes long, the adhesive 5 tends to wet-spread, however, the adhesive 5 is blocked by the pair of the metal oxide films 8 and the adhesive 5 is prevented from wet-spreading. Consequently, the height position of the adhesive 5 required to fill the gap between the case 7a and the metal base 1 caused by the corrugation of the metal base 1 or the shape difference between the case 7a and the metal base 1 can be secured.

As a result, even when the gap between the case 7a and the metal base 1 is large, the leakage of the sealing resin 6 can be suppressed by bonding the case 7a and the metal base 1 without a gap, so that the reduction in heat radiation property of the semiconductor device due to the bonding of the leaked sealing resin 6 to the metal base 1 can be suppressed. Further, by suppressing the leakage of the sealing resin 6, the required amount of the sealing resin 6 can be filled inside the case 7a, so that the indispensable insulating property can be secured. This ensures the manufacturing of a highly reliable semiconductor device.

In addition, by providing the pair of metal oxide films 8, a certain height position of the adhesive 5 can be secured even with a small amount of the adhesive 5, so that the productivity of the semiconductor device can be improved.

Further, the pair of the metal oxide films 8 is formed in a line along the peripheral edge portion on the metal base 1. Therefore, when the case 7a and the metal base 1 are bonded to each other, the adhesive 5 can be prevented from being pressed and spreading too much. As a result, the thickness of the adhesive 5 required to reduce the stress can be secured, so that the stress applied to the adhesive 5 can be reduced.

Further, in the step (b), the pair of the metal oxide films 8 is formed by applying laser energy to the peripheral edge portion on the metal base 1; therefore, the pair of the metal oxide films 8 can be easily locally formed in a short time. Further, even if a member has a large heat capacity such as the metal base 1, a laser having a high energy density can easily form the pair of the metal oxide films 8.

Second Embodiment

Figure 6:
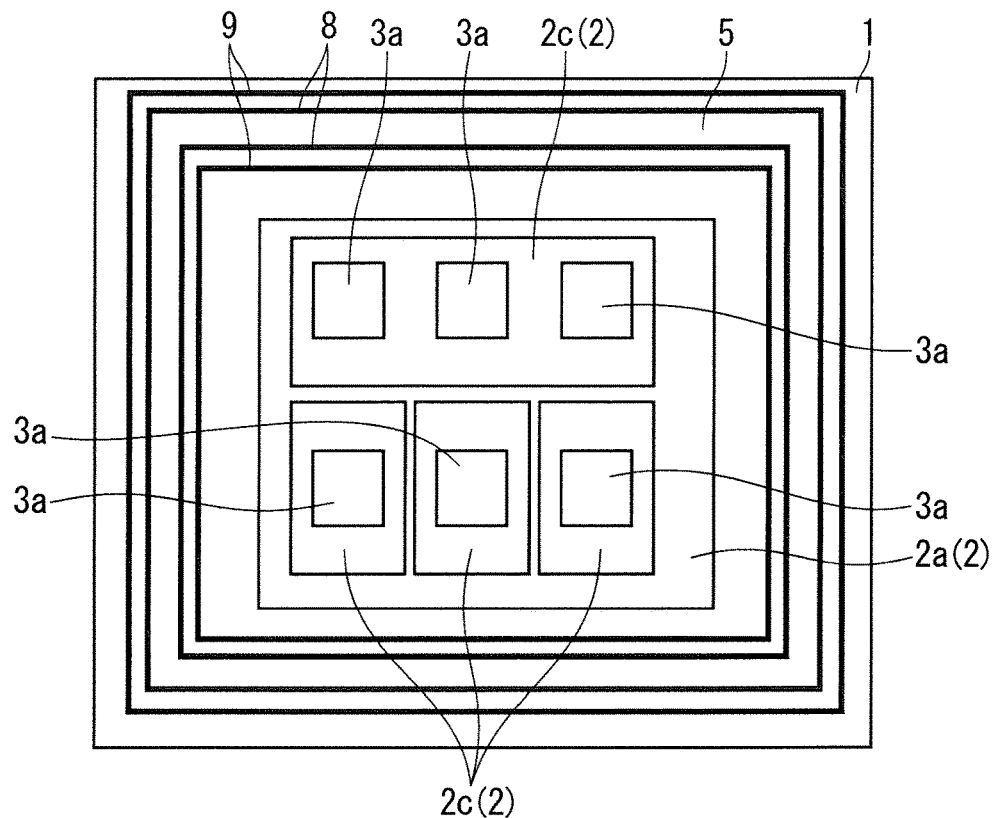
FIG. 6 is a top view illustrating a state before case bonding in a semiconductor device according to the second embodiment.
Figure 7:
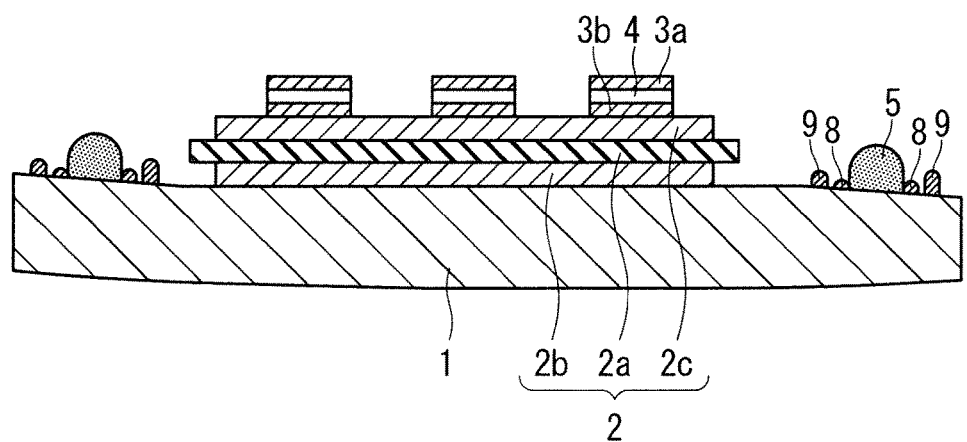
FIG. 7 is a cross-sectional view illustrating the state before case bonding in the semiconductor device according to the second embodiment.

Next, a semiconductor device according to the second embodiment will be described. FIG. 6 is a top view illustrating a state before case 7a bonding in the semiconductor device according to the second embodiment. FIG. 7 is a cross-sectional view illustrating the state before case 7a bonding in the semiconductor device according to the second embodiment. In the second embodiment, the same components as those described in the first embodiment are designated by the same reference numerals and the description thereof will be omitted.

As illustrated in FIGS. 6 and 7, in the second embodiment, the pair of metal oxide films 9 (corresponding to a second metal oxide film) having a protruding shape is further provided so as to surround the side surfaces of the metal oxide films 8 in the pair. That is, the pair of the metal oxide films 8, which is closer to the adhesive 5, and the pair of the metal oxide films 9 are arranged in this order.

The pair of the metal oxide films 9 is continuously formed in a line along the peripheral edge portion on the upper surface of the metal base 1. Also, the width of the pair of the metal oxide films 9 is constant. In order to block the adhesive 5 flowing over the pair of the metal oxide films 8 when the adhesive 5 is pressed and wet-spreads when the case 7a and the metal base 1 are bonded to each other, the height position of the upper end of the pair of the metal oxide films 9 is formed higher than the height position of the upper end of the pair of the metal oxide films 8.

The method of forming the pair of the metal oxide films 9 is the same as the method of forming the pair of the metal oxide films 8; therefore, the description thereof will be omitted.

The metal oxide films 9 in the pair do not necessarily surround the side surfaces of the metal oxide films 8 in the pair over the entire circumferences, and may be provided intermittently along the peripheral edge portion on the upper surface of the metal base 1, or may be locally provided at required places.

As described above, on the peripheral edge portion of the metal base 1, the metal oxide films 9 having a protruding shape in the pair are provided so as to surround the side surfaces of the metal oxide films 8. Therefore, when the adhesive 5 wet-spreads and flows over the pair of the metal oxide films 8, the pair of the metal oxide films 9 can block the adhesive 5. This improves the certainty of securing the height position of the adhesive 5 required for the first embodiment.

Further, the height position of the upper end of the pair of the metal oxide films 9 is higher than the height position of the upper end of the pair of the metal oxide films 8; therefore, when the case 7a and the metal base 1 are bonded to each other, the adhesive 5 can further be suppressed from being pressed and spreading too much. As a result, the thickness of the adhesive 5 required to reduce the stress can be secured, so that the stress applied to the adhesive 5 can be reduced.

Third Embodiment

Figure 8:
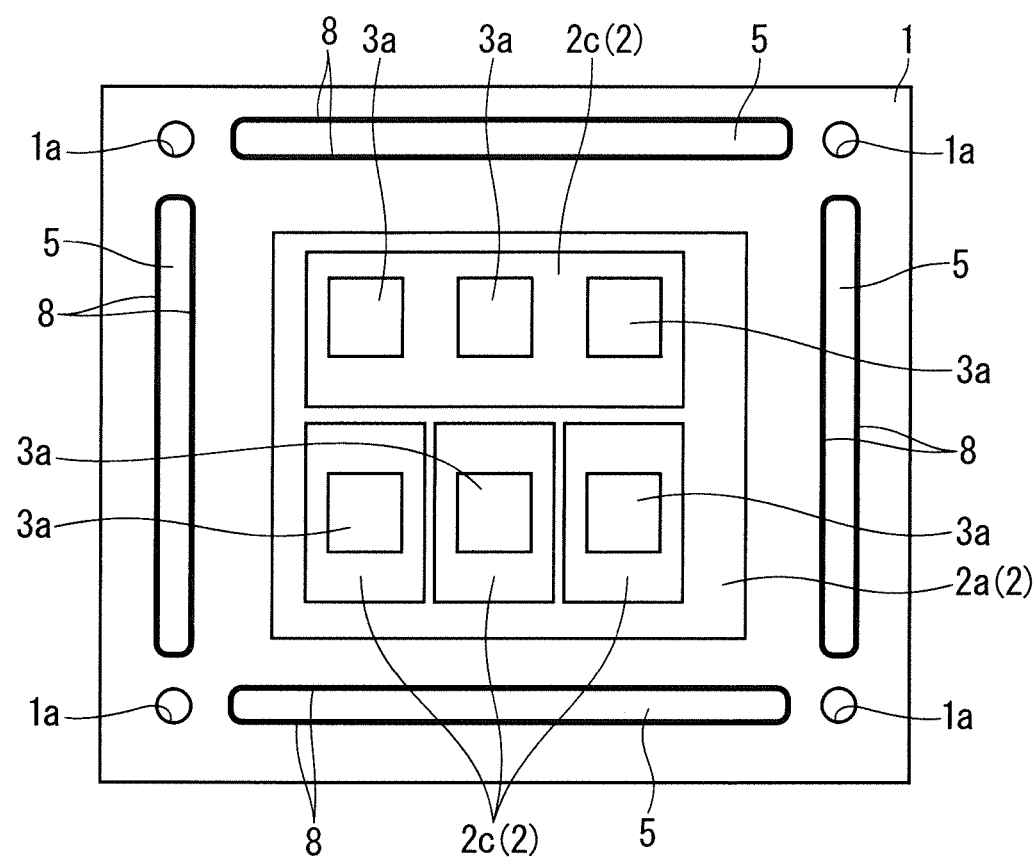
FIG. 8 is a top view illustrating a state before case bonding in a semiconductor device according to the third embodiment.

Next, a semiconductor device according to the third embodiment will be described. FIG. 8 is a top view illustrating a state before case 7a bonding in the semiconductor device according to the third embodiment. In the third embodiment, the same components as those described in the first and second embodiments are designated by the same reference numerals and the description thereof will be omitted.

As illustrated in FIG. 8, in the third embodiment, screw fastening is also used when the case 7a and the metal base 1 are bonded to each other.

Through holes 1a for screw fastening are provided at the four corners of the metal base 1. Holes for screw fastening (not illustrated) are provided at positions facing the through holes 1a of the metal base 1 in the case 7a. The case 7a and the metal base 1 are screw fastened from the lower surface of the metal base 1 through the holes and the through holes 1a.

As the screw used for screw fastening, a tapping screw may be used in addition to a typical external thread. Also, in screw fastening, a method of indirectly adjusting the screw fastening amount through a jig or the like may be used.

When the case 7a and the metal base 1 are bonded to each other by using screw fastening together, the adhesive 5 is not applied to the four corners of the metal base 1 because the adhesion to the case 7a can be secured by screw fastening. That is, the adhesive 5 is continuously arranged in a line on the peripheral edge portion of the upper surface of the metal base 1 except for the four corners. That is, the pair of metal oxide films 8 is continuously arranged in a line on the peripheral edge portion of the upper surface of the metal base 1 except for the four corners so as to surround the adhesive 5. Other than that, the basic configuration is the same as in the case of the first embodiment, however, the pair of the metal oxide films 9 may be further provided as in the case of the second embodiment.

As described above, in the semiconductor device according to the third embodiment, the through holes 1a for screw fastening are provided at the four corners of the metal base 1, the holes for screw fastening are provided at positions facing the through holes 1a of the metal base 1 in the case 7a, and the case 7a and the metal base 1 are screwed fastened through the holes and the through holes 1a.

Therefore, the case 7a and the metal base 1 can be bonded to each other by the adhesive 5 in a state of being screwed fastened; therefore, the case 7a and the metal base 1 can be bonded accurately and firmly with respect to the first and second embodiments.

In addition, the amount of the adhesive 5 applied can be suppressed by using screw fastening together.

Each embodiment can be combined, appropriately modified or omitted.

While the disclosure has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:
a metal base;
an insulating substrate arranged on the metal base;
a semiconductor element mounted on the insulating substrate; and
a case bonded on the metal base so as to surround side surfaces of the insulating substrate and the semiconductor element, wherein
a pair of first metal oxide films having a protruding shape is provided on a peripheral edge portion of the metal base, and
the case is bonded to the metal base by an adhesive arranged in a region between the first metal oxide films in the pair.

2. The semiconductor device according to claim 1, wherein
the pair of the first metal oxide films is formed in a line along the peripheral edge portion on the metal base.

3. The semiconductor device according to claim 1, wherein
a pair of second metal oxide films having a protruding shape is provided on a peripheral edge portion of the metal base so as to surround side surfaces of the pair of the first metal oxide films.

4. The semiconductor device according to claim 3, wherein
a height positon of an upper end of the pair of the second metal oxide films is higher than a height position of an upper end of the pair of the first metal oxide films.

5. The semiconductor device according to claim 1, wherein
a through hole for screw fastening is provided at a corner of the metal base,
a hole for screw fastening is provided at a position facing the through hole of the metal base in the case, and
the case and the metal base are fastened through the hole and the through hole.

6. A method of manufacturing a semiconductor device comprising the steps of:
(a) bonding an insulating substrate on a metal base and mounting a semiconductor element on the insulating substrate;
(b) forming a pair of first metal oxide films having a protruding shape on a peripheral edge portion of the metal base;
(c) applying an adhesive in a region between the first metal oxide films in the pair;
(d) bonding the case on the metal base by the adhesive;
(e) bonding a lead electrode provided on the case to the semiconductor element; and
(f) filling a sealing resin inside the case.

7. The method of manufacturing the semiconductor device according to claim 6, wherein
in the step (b), the pair of the first metal oxide films is formed by applying laser energy to the peripheral edge portion on the metal base.

* * * * *